United States Patent [19]

Kaneki et al.

[11] 4,374,912

[45] Feb. 22, 1983

[54] PHOTOMASK AND PHOTOMASK BLANK

[75] Inventors: Satoru Kaneki, Sayama; Yuzi Kikuchi, Sakado; Yoji Sasaki, Kokubunji, all of Japan

[73] Assignee: Dai Nippon Insatsu Kabushiki Kaisha, Tokyo, Japan

[21] Appl. No.: 319,962

[22] Filed: Nov. 10, 1981

[30] Foreign Application Priority Data

Mar. 31, 1981 [JP] Japan .................. 56-47922
Mar. 31, 1981 [JP] Japan .................. 56-47923

[51] Int. Cl.³ ............................................ B32B 9/00
[52] U.S. Cl. ................................. 430/5; 430/296; 430/313; 428/209; 428/469; 428/472
[58] Field of Search .............. 430/5, 316, 313, 296; 428/469, 472, 398, 701, 209

[56] References Cited

U.S. PATENT DOCUMENTS

| | | | |
|---|---|---|---|
| 3,857,689 | 12/1974 | Koizumi et al. | 427/98 |
| 3,907,620 | 9/1975 | Abraham et al. | 427/82 |
| 4,098,917 | 7/1978 | Bullock et al. | 430/316 |
| 4,190,315 | 2/1980 | Brettle et al. | 428/469 |
| 4,284,687 | 8/1981 | Dreyer et al. | 428/469 |

Primary Examiner—J. Travis Brown
Attorney, Agent, or Firm—Stevens, Davis, Miller & Mosher

[57] ABSTRACT

In a low reflection type photomask (hard mask) having a tantalum masking film provided, through or without an intermediary low reflection layer, on a transparent substrate and further having a low reflection layer provided on the tantalum layer, use is made of a composite layer containing tantalum oxide and tantalum nitride as the low reflection layer. The etching speed of the composite layer is faster than that of the tantalum oxide layer conventionally used as low reflection layer, being substantially equal to that of the tantalum film, and there is very little lowering of the dimensional precision of the photomask obtained due to the difference in etching speeds. Further, dry etching is applicable for the above multilayer masking film containing the composite layer and the masking tantalum film, and there is little lowering of the dimensional precision even by overetching.

10 Claims, 4 Drawing Figures

PHOTOMASK AND PHOTOMASK BLANK

BACKGROUND OF THE INVENTION

This invention relates to photomasks and photomask blanks indispensable for production of semiconductors, integrated circuits (IC), large-scale integrated circuits (LSI), color stripe filters, and other electronic products.

As the photomasks, which are original plates for printing very minute circuit patterns on semiconductor wafers and the like, there are inexpensive emulsion masks for users with relatively lower precision and hard masks having excellent durability for uses with high precision such as chromium masks, etc. In the latter hard masks, other than chromium films, chromium oxide films, iron oxide films and silicon films are practically used. Further, for use in the formation of submicron patterns on very-LSI, magnetic bubble devices, surface elastic wave devices and others, there have been developed hard masks with the use of a tantalum film having good dry etching adaptability and excellent durability, which is also a material of low toxicity, as is disclosed by Japanese Laid-open Patent Application No. 65673/1977.

This invention is intended to improve the characteristics of the tantalum multi-layer film hard mask as briefly described above thereby to realize a photomask with higher precision.

In general, hard masks are primarily of the type having a multi-layer film provided as the masking layer such as a two-layer type in which a reflection preventive film is provided on its outer surface for the purpose of avoiding repeated reflection between the mask and the wafer and also increasing the exposure latitude or a three-layer type in which the reflection on the opposite side is also prevented, thus being capable of actuating auto mask aligners. Most of the photomasks fabricated with the use of a tantalum material are also of such a constitution.

However, in tantalum masks having multi-layer structures, similarly as in case of chromium type multi-layer masks, oxide layers are employed as reflection preventive layers. Therefore, while these masks have excellent basic characteristics as described above, a difficulty as described below is encountered in the production thereof and gives rise to problems. That is, a tantalum oxide layer for prevention of reflection, which is ordinarily formed according to the anode oxidation method, is very firm as compared with the pure tantalum masking layer. On the other hand, the etching speed in a tantalum oxide layer is very slow with a Freon type gas such as carbon tetrafluoride, and it is difficult to use a large etching speed ratio relative to the photoresist formed as the upper layer during dry etching.

For this reason, while a wide process latitude is afforded in the case of a single tantalum film without substantial dimensional shift even when applying an overetching longer by two to three times than the just etching time, a dimensional variation similar to that in a chromium type mask will generally occur in case of a multi-layer film laminated with a tantalum oxide film. This is in contradiction to the purpose of high precision uses such as in the formation of submicron patterns. Further, since the etching speed is 4 to 5 times different from those in other layers, it is difficult to apply etching evenly, and irregularities are generally liable to be formed. This will lead under some conditions to defects caused by film residues formed by local underetching. The same applies to the case when the oxide film is formed by the sputtering method with the use of a tantalum oxide target.

As a second problem, there is the difficulty encountered in the formation of films. While the anode oxidation method makes possible uniform and bulk treatment for formation of an oxide film for a tantalum oxide layer, it is a wet process with the use of a chemical reagent and therefore must follow steps different from those of the dry process, such as sputtering employed for formation of a tantalum layer. Since this is a wet process, it entails complications in liquid handling with respect to impurities, foreign matters, particles, and the like, whereby defects are liable to be caused on the surface of a mask blank.

When the tantalum oxide layer is to be formed according to the reactive sputtering method with the use of a tantalum target and a gas mixture of oxygenargon, a substrate temperature ordinarily in the range of from 700° to 900° C. is essentially required. With such a requirement, it is impossible to form a very flat photomask blank with the use of glass as substrate. On the other hand, when the film formation is carried out at a substrate temperature not higher than 300° C., reproducibility of the degree of oxidation is poor, and the speed of the film formation is also very slow. In the production of photomask blanks wherein generation of even a very small defect is a great problem, as judged from the situation as described above, the all dry processes, especially the reactive sputtering method is preferable, but it is difficult to form laminated films of tantalum oxide and tantalum.

In order to eliminate the difference between the etching speeds of the tantalum oxide layer and the tantalum layer, it may be considered possible to vary the film quality of the tantalum oxide film by changing the conditions in the anode oxidation method or the sputtering method such as the liquid composition, gaseous composition, temperature, and current. However, the range of such a variation is very narrow, and a drastic change in conditions may result in impairment of the basic properties such as durability and optical characteristics of the film, or in marked lowering of productivity.

SUMMARY OF THE INVENTION

It is a primary object of the present invention to provide a tantalum multi-layer photomask with high precision as well as high durability in which the problems accompanying tantalum and tantalum oxide multi-layer photomasks are overcome and also its photomask blank.

We have carried out studies with the above object and consequently found that it is very effective for achievement of the above object to use a composite layer principally composed of tantalum oxide and tantalum nitride, in place of a tantalum oxide layer as a reflection protective layer, and to laminate it with a tantalum thin film. The present invention is based on this finding.

Thus, a characteristic feature of the photomask blank according to the present invention resides in a structure comprising a transparent substrate, and a layer of tantalum and a composite layer composed principally of tantalum oxide and tantalum nitride laminated successively on said transparent substrate.

The photomask according to the present invention is characterized in that the composite film and the tantalum film of the above photomask blank have been patternized.

In the photomask blank according to the present invention, since the etching speed is faster in the tantalum nitride film than in the tantalum film, a desired etching speed can be obtained by suitably varying the composition ratio of tantalum oxide to tantalum nitride.

As the method for forming the composite layer composed principally of tantalum oxide and tantalum nitride, reactive sputtering can be readily carried out with the use of oxygen gas and nitrogen gas, and no particularly high temperature is required for the formation of a desired film. Of course, it is also possible to effect lamination with the use of an oxide target with an appropriate composition.

The composite layer composed principally of tantalum oxide and tantalum nitride has optical characteristics, chemical resistance, film strength, and other characteristics which are substantially equal to those of a tantalum oxide film, and, moreover, etching characteristics equal to those of a tantalum layer are obtainable, whereby a high precision mask without dimensional shift as described above can be realized.

The nature, utility, and further features of this invention will be more clearly apparent from the following detailed description, beginning with a consideration of general aspects of the invention and concluding with specific examples of practice thereof, when read in conjunction with the accompanying drawing, briefly described below.

DETAILED DESCRIPTION OF THE INVENTION

Figure 1A:
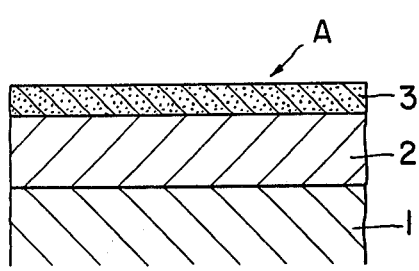
FIGS. 1a and 1b are schematic sectional views, with parts cut away, respectively showing examples of multi-layer photomask blanks according to this invention.

FIG. 1a is a schematic view of the sectional structure of one embodiment of the photomask blank according to this invention. This blank A is intended for use in the formation of one-side low-reflection photomasks. On a transparent substrate 1 having a surface polished to ample smoothness and made of soda lime glass, borosilicate glass, quartz glass, sapphire or the like, there is provided a tantalum film 2 generally of a thickness of 300 to 1,500 Å, on which is further provided, as a reflection preventive film, a composite layer 3 composed principally of tantalum oxide and tantalum nitride, generally of a thickness of 200 to 500 Å.

Figure 1B:
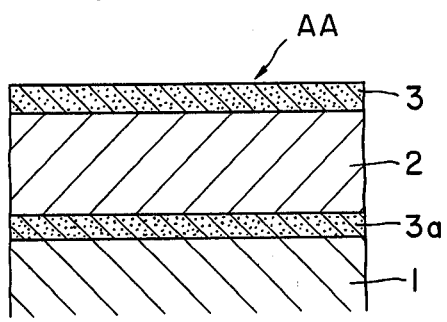

FIG. 1b is a schematic sectional view of another embodiment of the photomask blank according to this invention. This blank AA is intended for use in the formation of both-side low-reflection photomasks. This blank AA is essentially a photomask blank as shown in FIG. 1a in which is further interposed a composite layer 3a composed principally of tantalum oxide and tantalum nitride similar to (but not required to be exactly the same as) the layer 3, generally of a thickness of 200 to 500 Å, between the transparent substrate 1 and the tantalum film 2.

When the composition constituting the composite layer 3 or 3a composed principally of tantalum oxide and tantalum nitride in this invention is represented by $Ta_xN_yO_z$, it is suitably within the ratio range of $x=1$, $y=0.15$ to $0.5$ and $z=1.0$ to $2.5$ (atomic ratio). Practically, it is necessary to select optimum values for x, y and z so that the etching speeds in all films will coincide with each other in conformity with the device and conditions for the formation of the film.

Next, as the method for the preparation of the composite film 3 or 3a composed principally of tantalum oxide and tantalum nitride in the present invention, there is an inert sputtering method wherein a target comprising Ta, N and O prepared by, for example, sintering a mixture of tantalum oxide and tantalum nitride in the form of powders is used; a reactive sputtering method with the use of tantalum as target in an atmosphere of a gas mixture of $N_2$ and $O_2$; or an electron-beam vacuum evaporation method with the use of an evaporation source comprising Ta, N and O as mentioned above. Among the methods, as mentioned previously, the reactive sputtering method is the most preferable. In forming successively the tantalum film 2 and the composite film 3 (and 3a) on the transparent substrate 1, the source composition can be changed in the sputtering method or the vacuum evaporation method, while the atmosphere can be changed from an inert gas to a $N_2$—$O_2$ gas mixture in the reactive sputtering method, thereby to make possible preparation of multi-layer mask blanks according to the same method without taking out the product once into the atmosphere. The state of existence of tantalum oxide and tantalum nitride in the thus prepared composite film 3 or 3a, while it has not yet been clarified in detail, seems to be that of a higher order compound rather than a simple mixture or a mixed state of a simple mixture with a higher order compound. It is also permissible to incorporate other elements in the composite film 3 or 3a in small amounts which will not substantially influence the etching speed thereof.

Figure 2A:
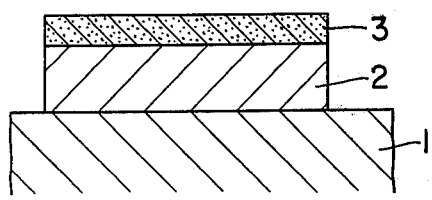
FIGS. 2a and 2b are schematic sectional views, with parts cut away, respectively showing examples of multi-layer photomasks according to this invention obtained by the use of the above photomask blanks.
Figure 2B:
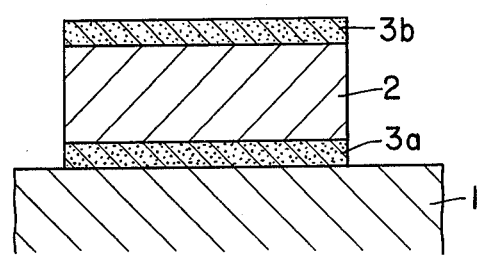

In order to prepare a photomask as shown in FIG. 2a or 2b from a photomask blank thus prepared as shown in FIG. 1a or 1b, a conventional photolithography or electron beam lithography process for patternization of the tantalum film 2 and the composite film 3 (also 3a, if necessary) may be used. Thus, a photoresist or an electron beam resist is applied as coating on the composite film 3 of the photomask blank as shown in FIG. 1, and then a pattern exposure is carried out with ultraviolet rays or an electron beam. This step is then followed by development of the photoresist by using a developer prescribed therefor, and then the exposed composite film 3 (and 3a) and the tantalum film 2 are subjected to etching. When etching is performed by dry etching with the use of a gas such as $CF_4$ or $CF_4+O_2$, overetching is tolerable to a considerable extent without substantial change in dimensions, whereby there can easily be obtained a photomask with a high precision. Similar effects can also be obtained when using a resist having resistance to hydrofluoric acid or a metallic film as resist and conducting wet etching with the use of an HF type etchant or a hot alkali.

The photomask according to this invention is tough and has excellent resistance to various mask washing solutions. Thus, the photomask of this invention suffers from substantially no change in both surface reflectance and optical density when tested by immersion in a mixture of $H_2O_2$ and $H_2SO_4$ at 110° C. for a total of 10 hours, in a mixture of $KNO_3$ and $H_2SO_4$ at 80° C. for 50 hours, or in a mixture of $K_2Cr_2O_7$ and $H_2SO_4$ for 50 hours. Further, the photomask can be subjected to scrubber washing with a rotating nylon brush or a high-pressure water washing under 2,000 psi without any change in image lines.

In order to indicate more fully the nature and utility of this invention, the following examples are set forth, it being understood that these examples are presented as illustrative only and are not intended to limit the scope of the invention.

EXAMPLE 1

On a synthetic quartz glass substrate, whose surface had been polished to ample smoothness, a tantalum film was formed to a thickness of 600 Å by sputtering under the following conditions:
  Atmosphere: Argon (100%)
  Pressure: $2 \times 10^{-2}$ Torr
  Substrate-target distance: 5 cm
  Sputtering speed: 100 Å/min.

Next, on the tantalum film, a composite film composed principally of tantalum nitride and tantalum oxide was formed to a thickness of 250 Å by sputtering under the following conditions:
  Atmosphere: Argon (100%)
  Pressure: $1 \times 10^{-2}$ Torr
  Substrate-target distance: 5 cm
  plasma excitation: High frequency wave (13.56 MHz)
  Sputtering speed: 25 Å/min.
  Sputter target: Sintered product of $TaO_2/TaN$ (Ta:N:O = 1:0.3:1.6)

The photomask blank thus prepared was found to have a surface reflectance of 5% for Hg-g line and an optical density of 3.0.

Then, according to the well known photolithography process, an AZ-1350 photoresist pattern was formed on the blank. This step was followed by dry etching under the following conditions to obtain a photomask having very sharp image lines with minimum line width of 0.5 μm:
  Dry etching gas: $CF_4$ (100%)
  Pressure: 10 mTorr
  Device: Parallel flat plate counter-electrode type
  Power density: 0.3 W/cm$^2$
  Etching time: 2 minutes.

The above dry etching procedure was repeated except for a dry etching time of 15 minutes to obtain the same pattern photomask with difference in dimensions of less than 0.05 μm, as compared with the former one. These photomasks were immersed in a mixture of 100 g of $K_2Cr_2O_7$ and 1,000 ml of $H_2SO_4$ at 80° C. for 50 hours. As a result, there was no problem in the characteristics of the photomask with respect to reflectance, optical density and defect.

EXAMPLE 2

On an LE-30 glass substrate (produced by Hoya Denshi K.K.) having a well polished surface, a composite film composed principally of tantalum oxide and tantalum nitride was formed to a thickness of 400 Å by reactive sputtering under the following conditions:
  Atmosphere: Gas mixture of Ar (55%)+He (10%)+$N_2$ (30%)+$O_2$ (5%)
  Pressure: $2 \times 10^{-2}$ Torr
  Target-mask distance: 5 cm
  Sputtering speed: 30 Å/min.

Next, a tantalum film was formed thereon to a thickness of 500 Å under the same conditions as described in Example 1. Further, as the third layer, a composite film composed principally of tantalum oxide and tantalum nitride was formed again by reactive sputtering to a thickness of 300 Å.

The composition of Ta:N:O (atomic ratio) in the composite film in the resultant photomask blank was found to be 1:0.5:1.7. The blank was found to have a surface reflectance of 7% for Hg-g line, a backside reflectance of 14% for Hg-e line and an optical density of 2.8.

Then, according to the well known photolithography process, an AZ-1350 photoresist pattern was formed on the mask blank. Then dry etching was effected thereon under the following conditions:
  Etching gas: Gas mixture of $CF_4$(100%)+$O_2$(5%)
  Device: Parallel flat plate counterelectrode type (interelectrode distance = 10 cm)
  Power density: 0.5 W/cm$^2$
  Etching time: 2-15 minutes (varied)

Comparison was made between the photomasks with various etching times with respect to the dimension of a 1-μm-wide image line. As a result, the difference of dimensions was less than 0.05 μm.

The photomasks as prepared above were subjected to the chemical resistance tests similarly conducted as in Example 1, whereupon it was found that there was substantially no change in mask precision and no increase in defects.

What is claimed is:

1. A photomask blank comprising a transparent substrate and a layer of tantalum and a composite layer composed principally of tantalum oxide and tantalum nitride formed successively on said substrate.

2. A photomask blank according to claim 1, wherein another composite layer composed principally of tantalum oxide and tantalum nitride is further interposed between the tantalum layer and the transparent substrate.

3. A photomask blank according to claim 1, wherein the atomic ratio of Ta:N:O in the composite layer is in the range of 1:0.15–0.5:1.0–2.5.

4. A photomask blank according to claim 1, wherein the composite layer is formed by sputtering or vacuum evaporation using as source a sintered product of mixed powders of tantalum oxide and tantalum nitride.

5. A photomask blank according to claim 1, wherein the composite layer is formed by reactive vacuum evaporation or reactive sputtering using tantalum as source in an atmosphere of mixed $N_2$—$O_2$ gas.

6. A photomask blank according to claim 1, wherein the composite layer has a thickness in the range of from 200 to 500 Å.

7. A photomask comprising a transparent substrate and a patternized multi-layer masking film provided on the substrate, said multi-layer masking film comprising a layer of tantalum and a composite layer of tantalum oxide and tantalum nitride laminated on said tantalum layer.

8. A photomask according to claim 7, wherein another composite layer of tantalum oxide and tantalum nitride is further interposed between the tantalum layer and the transparent substrate.

9. A photomask according to claim 7, wherein the atomic ratio of Ta:N:O in the composite layer is in the range of 1:0.15–0.5:1.0–2.5.

10. A photomask according to claim 7, wherein the multi-layer masking film is patternized by dry etching.

* * * * *